(12) United States Patent
Ohshima (10) Patent No.: US 6,280,218 B1
(45) Date of Patent: *Aug. 28, 2001

(54) SOCKET FOR ELECTRICAL PARTS (75) Inventor: Hisao Ohshima, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/522,281

(22) Filed: Mar. 9, 2000

(30) Foreign Application Priority Data

Jan. 16, 1997 (JP) .................................................... 9-017868

(51) Int. Cl.⁷ .................................................... H01R 11/22
(52) U.S. Cl. .............................................................. 439/268
(58) Field of Search ..................... 439/259, 263, 439/264, 266, 268

(56) References Cited

U.S. PATENT DOCUMENTS

| | | | |
|---|---|---|---|
| 5,059,135 | * 10/1991 | Matsuoka et al. | 439/268 |
| 5,342,213 | * 8/1994 | Kobayashi | 439/268 |
| 5,690,281 | * 11/1997 | Ikeya et al. | 439/268 |
| 6,042,409 | * 3/2000 | Ohshima | 439/268 |

FOREIGN PATENT DOCUMENTS

| | | |
|---|---|---|
| 58-150281 | 9/1983 | (JP) . |
| 61-116783 | 6/1986 | (JP) . |

\* cited by examiner

*Primary Examiner*—Khiem Nguyen
(74) *Attorney, Agent, or Firm*—Fish & Richardson P.C.

(57) ABSTRACT

A socket for an electrical part comprises a socket body, a contact pin disposed to the socket body, a movable member mounted on the socket body and adapted to displace the contact pin, and an operation unit for moving the movable member to thereby displace the contact pin. When the the contact pin is displaced, a terminal having a spherical outer shape of an electrical part is fitted to the socket body with the terminal being in non-contact state to clamping pieces of the contact pin and when the movable member is returned to an original position before movement therebetween, the displacement of the contact pin is released and the terminal of the electrical part contacts an contacting portion of the contact pin to thereby establish an electrical connection therebetween. The direction of the displacement of the contacting portion of the contact pin is set to a direction oblique to a moving direction of the movable member.

2 Claims, 11 Drawing Sheets

SOCKET FOR ELECTRICAL PARTS

This application is a divisional of U.S. application Ser. No. 09/007,463, filed Jan. 14, 1998, now U.S. Pat. No. 6,042,409, issued Mar. 28, 2000.

BACKGROUND OF THE INVENTION

1. Field of the Invention

The present invention relates to a socket for electrical parts having an improved structure capable of detachably holding electrical parts such as semiconductor devices, called hereinlater IC package(s).

2. Prior Art of the Invention

Sockets for electrical parts of the kinds mentioned above are known as disclosed for example in Japanese Patent Publication No. HEI 3-66787. An IC package mentioned herein as electrical part has an arrangement in which a number of IC leads project from a lower surface thereof in a lattice arrangement having vertical rows Y and transverse rows X.

An IC socket, as a socket for electrical parts, for supporting such IC package and achieving electrical connection has a rectangular outer configuration formed of an electrically insulating material and is provided with a substrate on which a cover is applied to be horizontally movable to open or close the upper surface thereof.

The cover is formed with a number of through holes, corresponding to the lattice arrangement of the IC leads, through which a number of IC leads are inserted, and these through holes, as insertion holes, provide a parallelogram shape in arrangement and the directions of the vertical and transverse rows of the leads are inclined by 45° with respect to respective sides of the cover configuration.

The substrate is formed with a number of contact groups in a lattice arrangement corresponding to the IC leads and IC lead insertion hole groups.

When the cover is moved along a direction of one of diagonal lines of the lattice arrangement, the IC package mounted on the cover is also moved, whereby the respective IC leads and the contacts are separated from or contacted to each other.

However, in such conventional arrangement, the IC lead insertion hole groups are inclined by 45° with respect to the rectangular configuration of the cover for ensuring displacement amount of the contacts which are separated from or contacted to the IC leads, resulting in an enlargement of the cover and hence the device itself, thus providing a problem.

SUMMARY OF THE INVENTION

An object of the present invention is to substantially eliminate defects or drawbacks encountered in the prior art described above and to provide a socket for electrical parts capable of ensuring a displacement of a contact member such as contact pin and realizing a reduced entire size.

Another object of the present invention is to provide a socket for an electrical part capable of achieving a wiping effect due to a contacting portion of a contact pin and suppressing a force directing obliquely upward from acting on a terminal by reducing a vertical displacement of an upper end of the contact pin.

A further object of the present invention is to provide a socket for an electrical part capable of centering a position of a terminal of the electrical part, when shifted, by a contact pin, and preventing the terminal from being applied by an desired force.

These and other objects can be achieved according to the present invention by providing a socket for an electrical part, which comprises a socket body, a contact pin disposed to the socket body, a movable member mounted on the socket body and adapted to displace the contact pin, and an operation member for moving the movable member to thereby displace the contact pin, and in which when the contact pin is displaced, a terminal of an electrical part is fitted to the socket body with the terminal being in non-contact state to the contact pin and when the movable member is returned to an original position before movement thereof, the displacement of the contact pin is released and the terminal of the electrical part contacts an contacting portion of the contact pin to thereby establish an electrical connection, wherein the direction of the displacement of the contacting portion of the contact pin is set to a direction oblique to a moving direction of the movable member.

In preferred embodiments, the contact pin is twisted by being pressed by the movable member through which the contacting portion of the contact pin is displaced in the direction oblique to the moving direction of the movable member. The movable member is provided with a pressing portion pressing the contact pin and the pressing portion is formed obliquely with respect to the moving direction of the movable member and the contacting portion of the contact pin is moved parallelly in an oblique direction with respect to the moving direction of the movable member by pressing the contact pin by the pressing portion.

The contact pin is composed of a plurality of clamping pieces between which the terminal of the electrical part is clamped, one of the clamping pieces being elastically deformable by a pressure of the movable member.

The terminal of the electrical part has preferably a spherical outer shape.

In more detail in structure, there is provided a socket for an electrical part, comprising:

a socket body;

a contact pin having a plurality of clamping pieces and disposed to the socket body;

a movable member mounted on the socket body and adapted to displace the contact pin; and an operation member for moving the movable member to thereby displace the contact pin, the electrical part having a terminal having a spherical outer shape and being fitted to the socket body in a non-contact state to the contact pin through a displacement of the contact pin when the movable member is moved, the displacement being released when the movable member is returned to an original position before movement thereof to thereby establish an electrical connection between the terminal and the contact pin, wherein the contacting portion of the contact pin is displaced by being twisted through the movement of the movable member in a direction oblique to a moving direction of the movable member.

According to the characters and structures of the present invention described above, the contacting portion of the contact pin is moved in a direction oblique to the moving direction of the movable member, so that the displacement amount of the contacting portion can be ensured, and moreover, the orientation (X- and Y-directions) of the contacting portions of the contact pins are made coincident with the respective sides of the socket for an electrical part having a rectangular outer shape. As a result, the outer configuration of the socket for the electrical part can be made compact in comparison with a conventional structure.

Furthermore, since the contact pin is twisted by being pressed by the movable member, the contacting portion of the contact pin is displaced in the direction oblique to the moving direction of the movable member likely in a manner to be rotatable, thus achieving the wiping effect, and moreover, the vertical displacement of the contact pin due to the twisting motion thereof can be made small in comparison with a conventional flexible structure of the contact pin, whereby the oblique contacting of the contact pin to the terminal can be suppressed and, hence, an upward force can be suppressed from acting on the terminal.

Still furthermore, the contact pin is provided with a plurality of clamping pieces between which the terminal of the electrical part is clamped and one of these clamping pieces is elastically deformed by the pressure of the movable member, so that the terminal is clamped by the deformable clamping piece even if the terminal is shifted in its position, whereby the centering of the terminal can be done by the respective clamping pieces and the acting of compulsory force on the terminal can be also prevented.

The nature and further characteristic features of the present invention will be made more clear from the following descriptions made with reference to the accompanying drawings.

BRIEF DESCRIPTION OF THE DRAWINGS

In the accompanying drawings:

FIG. 3 is a front view of the IC socket according to the first embodiment;

FIGS. 6A and 6B are a plan view showing an arrangement of a through hole of an upper plate, the solder ball and the contact pin according to the first embodiment, in which FIG. 6A shows a state in which one of clamping pieces of the contact pin is separated from the solder ball and FIG. 6B shows a state in which the solder ball is supported by both clamping pieces of the contact pin;

FIGS. 7A and 7B are a sectional view concerning the state of FIG. 6, in which FIG. 7A is a sectional view taken along the line VIIA—VIIA in FIG. 6 and FIG. 7B is a sectional view taken along the line VIIB→VIIB in FIG. 6;

FIGS. 9A, 9B and 9C represent, an IC package according to the first embodiment, in which FIG. 9A is a front view of the IC package, FIG. 9B is a bottom view thereof and FIG. 9C is a view showing an arrangement of the solder balls;

DESCRIPTION OF THE PREFERRED EMBODIMENTS

First Embodiment

FIGS. 1 to 9 represent a first embodiment of the present invention, in which reference numeral 11 denotes an IC socket as a "socket for electrical parts" and the IC socket 11 is a part for establishing an electrical connection between a solder ball 12b as a "terminal" of an IC package 12 as electrical part and a print wiring board, not shown, of a tester for carrying out a performance test of the IC package 12.

Figure 9A:
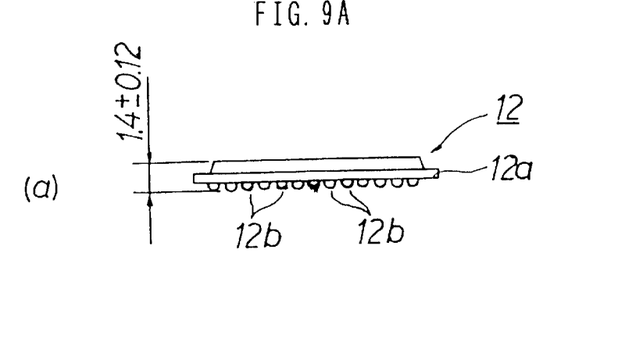
Figure 9B:
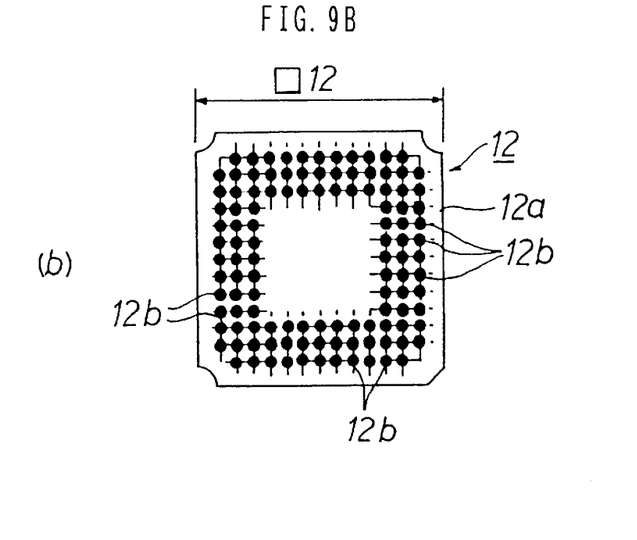
Figure 9C:
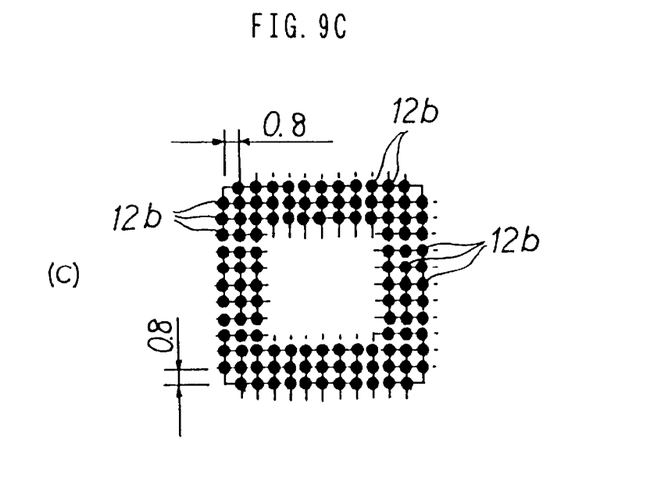

The IC package 12 is formed, as shown in FIG. 9, with a number of solder balls 12b projecting downward from the lower surface of an package body 12a, and these solder balls 12b are arranged so as to provide a lattice arrangement including vertical rows Y and transverse rows X. In this embodiment, the IC package 12 has a thickness of 1.4 mm and each side length of 12 mm, and the solder balls 12b each has a diameter of 0.4 mm and are arranged with a pitch of about 0.8 mm.

The IC socket 11 has a socket body 13 to be mounted on a print wiring board, and a rectangular movable plate 14 as a movable member is disposed on the socket body 13 to be horizontally movable in the X-direction in a manner such that when the movable plate 14 is horizontally moved, a contact pin 19 disposed on the socket body 13 is elastically deformed. An upper plate 16 is disposed above the movable plate 14 in a manner fixed to the socket body 13, and an upper operation member 17 having a rectangular frame structure is disposed further above these elements to be vertically movable in a manner such that when the upper operation member 17 is vertically moved, the movable plate 14 is moved in the horizontal direction through an X-shaped link 18.

Figure 1:
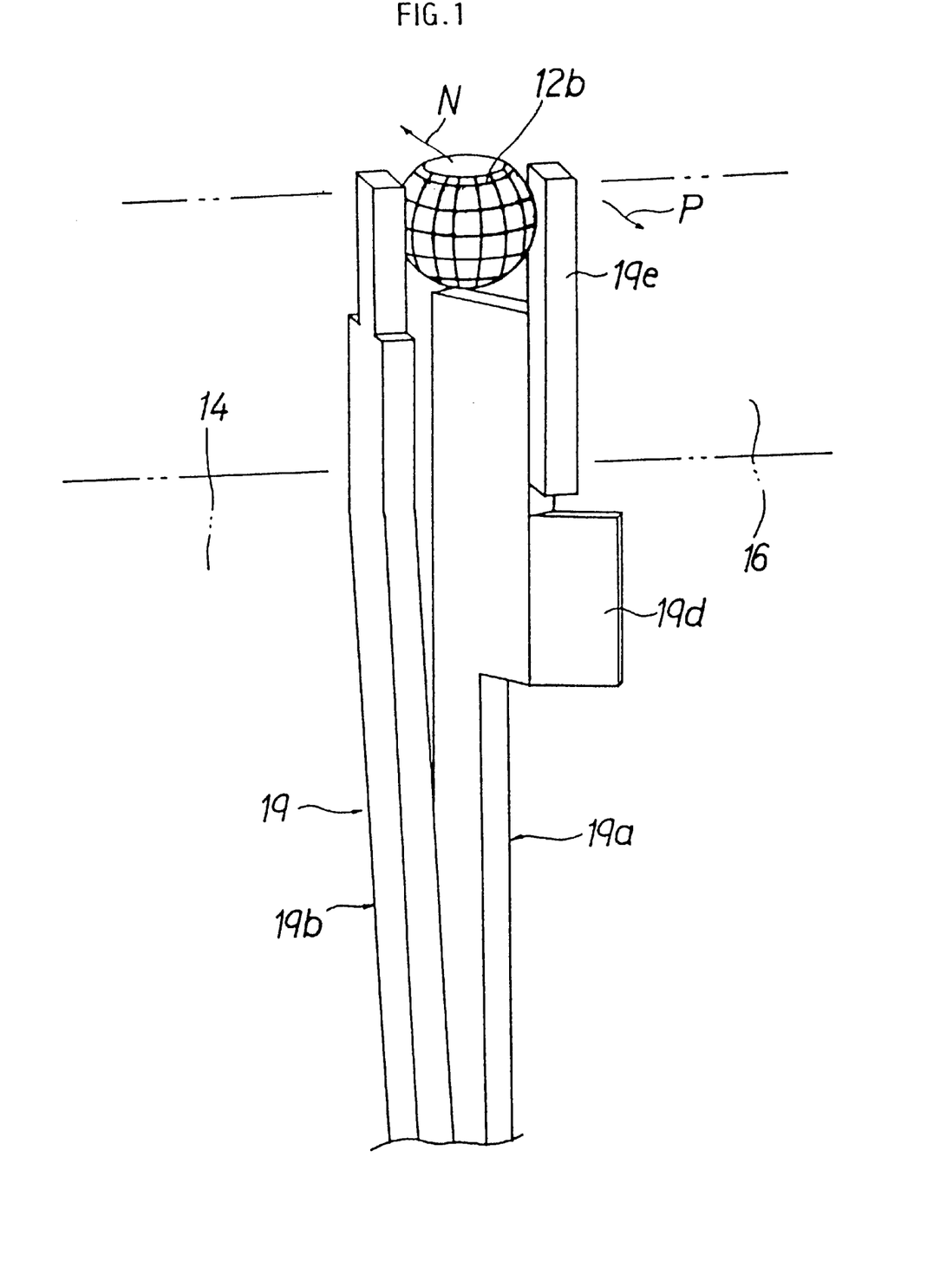
FIG. 1 is a perspective view showing arrangement of a contact pin, a solder ball, etc. constituting a first embodiment of the present invention.

In more detail, the contact pin 19 is composed of, for example, as shown in FIG. 1, an elongated member having an upper portion folded and separated into a pair of clamping pieces 19a, 19b by which the solder ball 12b is supported, and the contact pin 19 has springy property and electrical conductivity.

Figure 4:
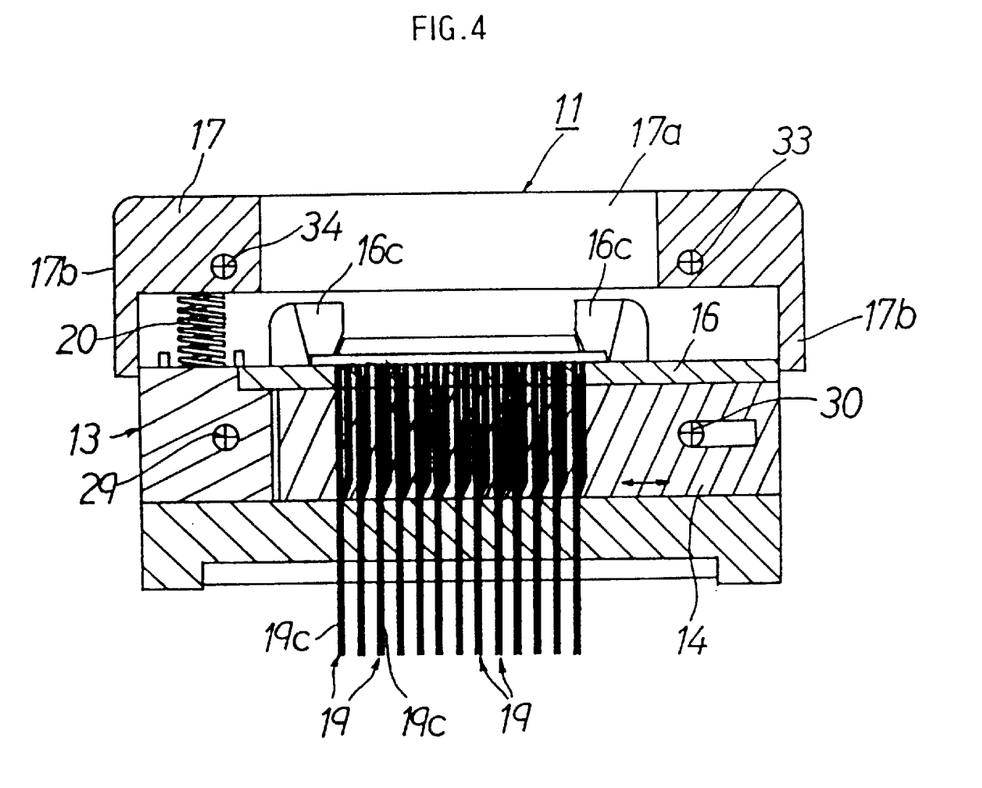
FIG. 4 is a sectional view of the IC socket of the first embodiment.
Figure 5:
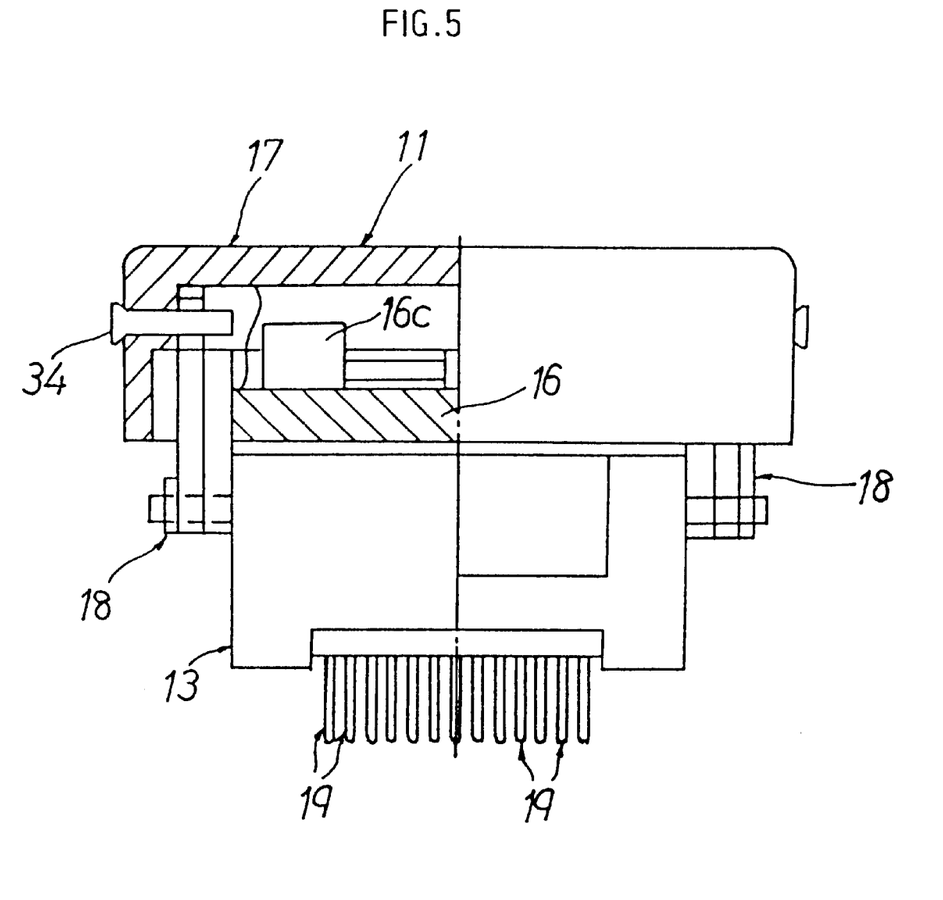
FIG. 5 is a right side view of the IC socket of the first embodiment.
Figure 7A:
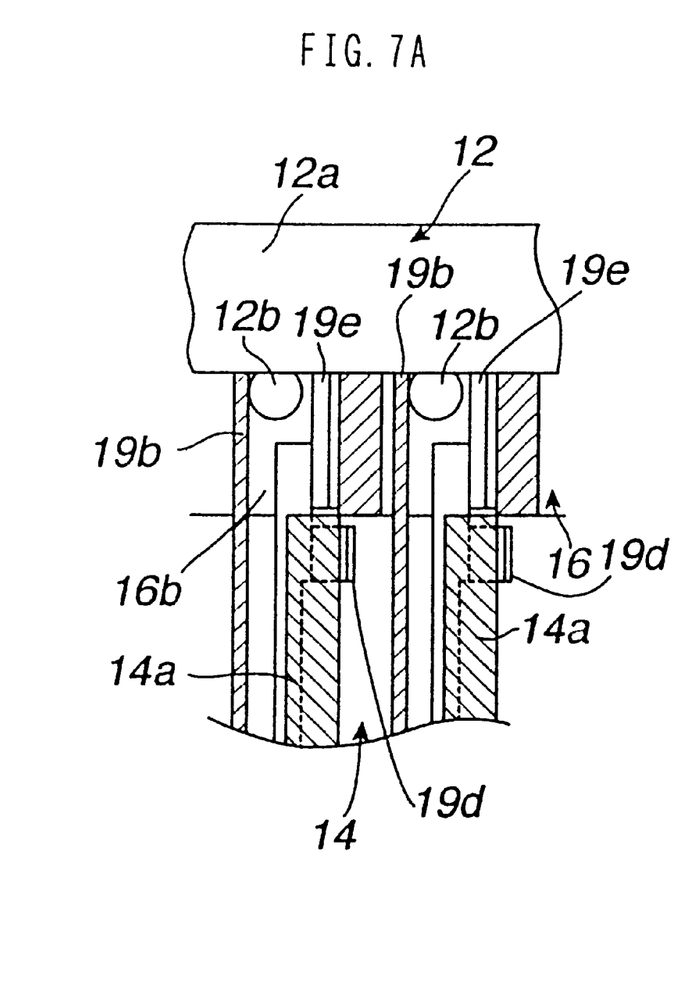
Figure 7B:
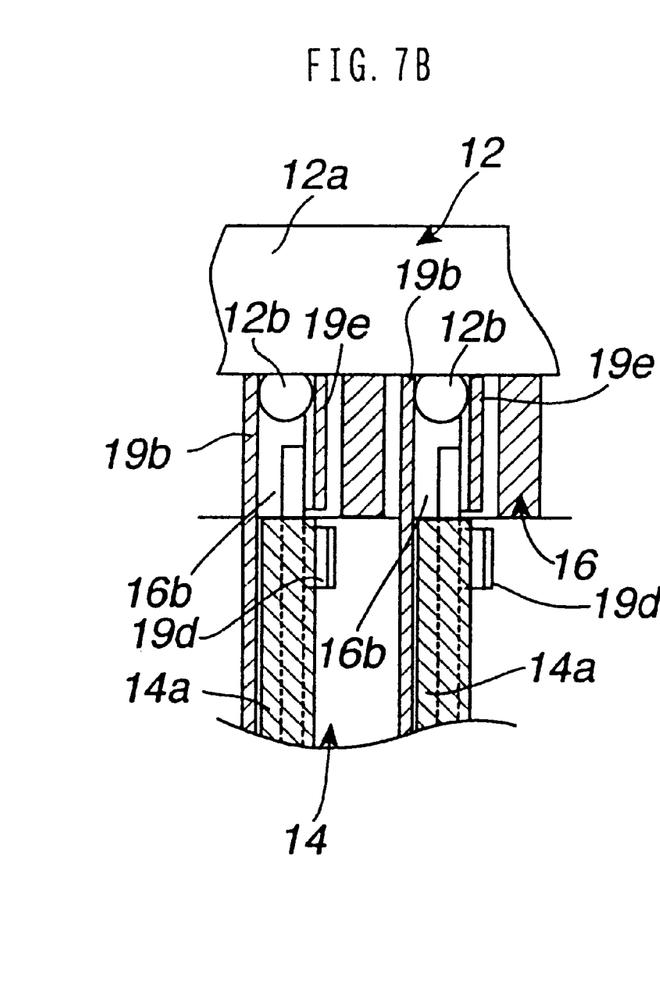

The contact pin 19 has a lower portion press-fitted into the socket body 13, as shown in FIG. 4, and lead elements 19c projects downward from the lower surface of the socket body 13, the lead elements 19c being electrically connected to the print wiring board. The clamping pieces 19a, 19b of the contact pin 19 projecting upward over the upper surface of the socket body 13 are inserted into through holes 16b formed to the movable plate 14 and the upper plate 16 as shown in FIG. 7.

Figure 8:
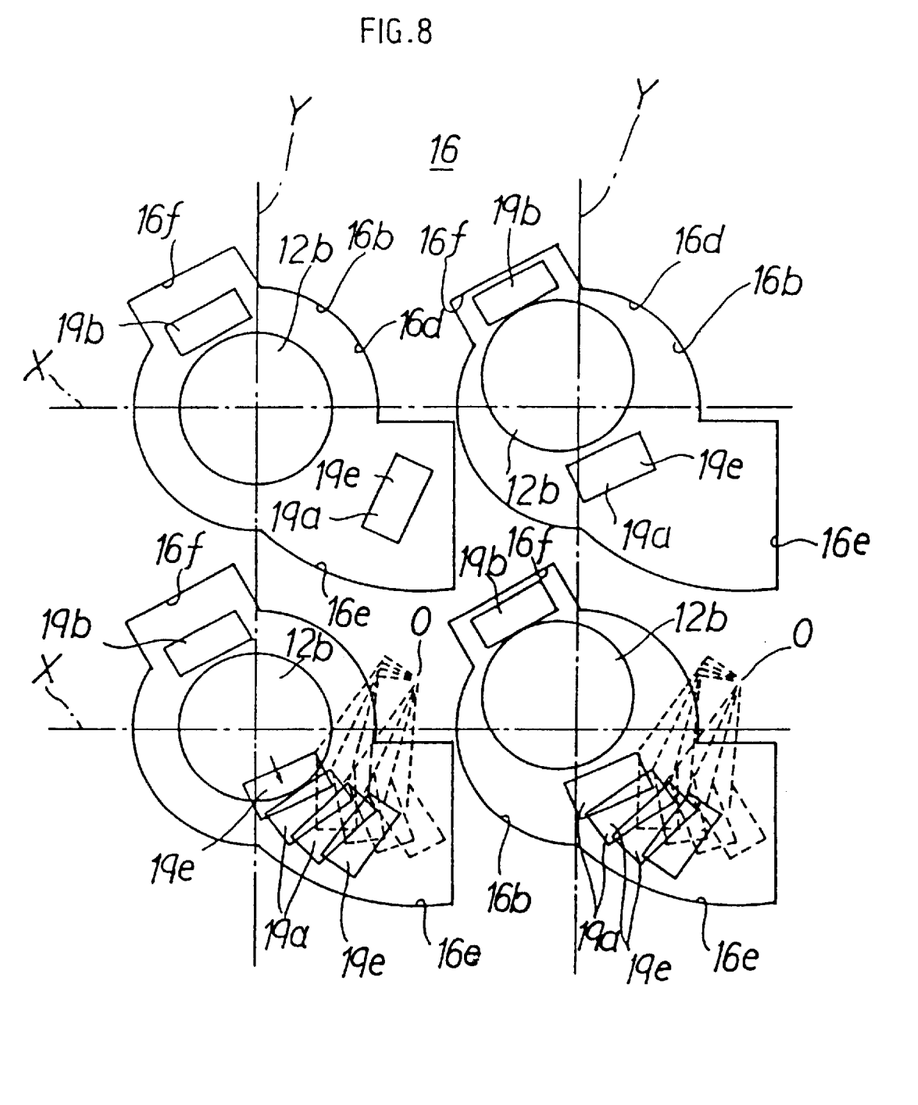
FIG. 8 is an illustration for explaining a function of the first embodiment.

One 19a of the clamping pieces is provided with a portion 19d to be pressed by the movable plate 14 as shown in FIG. 1, and when this portion 19d is pressed, it is twisted and a contacting portion 19e of the clamping piece 19a is rotated about a portion O in FIG. 8, whereby the contact piece 19a is separated from or contacted to the solder ball 12b. On the other hand, the other one 19b of the clamping pieces is not pressed by the movable plate 14 and is contacted to the solder ball 12b due to its elastical property. These clamping pieces 19a and 19b are positioned on opposing both sides of the solder ball 12b to thereby clamp the same in directions with angles of 45° with respect to the vertical rows Y and the transverse rows X of the arrangement of the solder balls 12b. According to such arrangement, when the movable plate 14 is moved along the X-direction, the moving direction of the contacting portions 19e of one clamping piece 19a is set to a direction oblique to the moving direction of the movable plate 14.

Furthermore, the upper plate 16 has a rectangular shape having four corner portions to which recessed portions are formed, respectively, and a plurality of positioning bosses, not shown, projecting from the socket body 13 are fitted to the recessed portions to thereby fix the upper plate 16 to the socket body 13 at the position above the movable plate 14. The movable plate 14 is formed with insert portions through which the positioning bosses are idly inserted, the insert portion having a size allowing the movable plate 14 to be movable without interfering with the positioning boss when the movable plate 14 is moved.

Figure 6A:
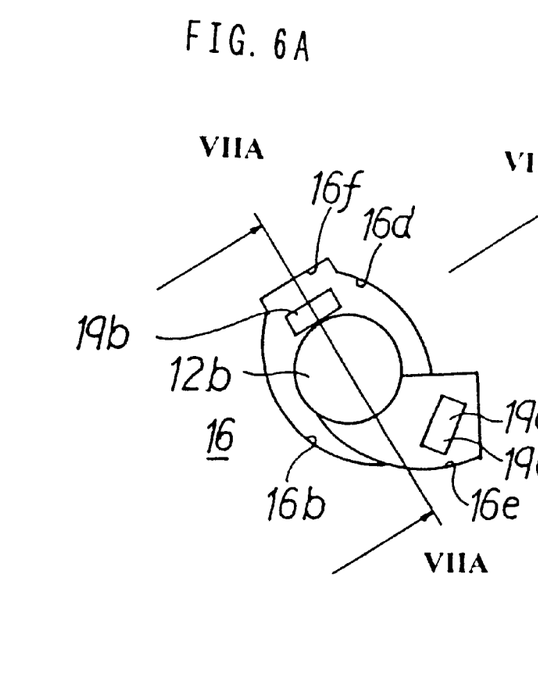
Figure 6B:
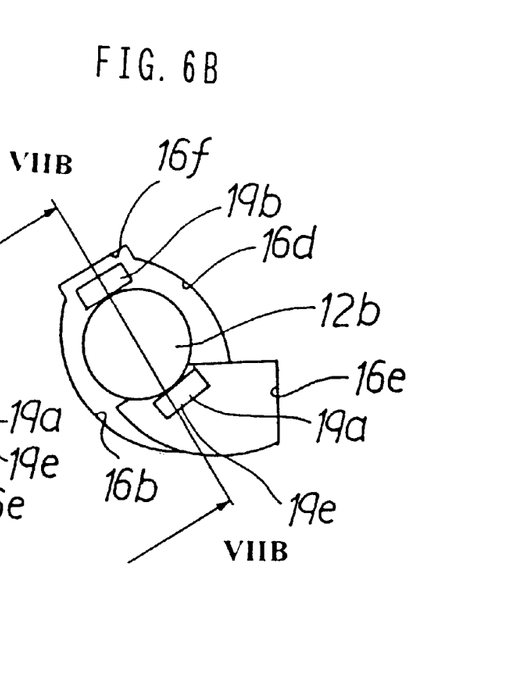

As shown in FIG. 6, the upper plate 16 is formed with a number of through holes 16b, in a lattice arrangement of vertical and transverse rows Y and X, into which the solder balls 12b of the IC package 12 are inserted. Each of the through hole 12b is composed of a circular portion 16d into which the solder ball 12b is inserted, a first cutout portion 16e into which the one 19a of clamping pieces is inserted and which is adapted to allow the displacement of the clamping piece 19a and a second cutout portion 16f into which the other one 19b of clamping pieces is inserted and which is adapted to allow the displacement of the clamping piece 19b. The circular portion 19d is formed to provide slightly large size so as to handle the solder balls even if they have slightly different diameters. Furthermore, as shown in FIGS. 2 and 4, the upper plate 16 is also formed with four projecting guide portions 16c, at portions corresponding to the respective four corner portions of the IC package, for positioning the IC package 12 when mounted to the upper plate 16.

Figure 2:
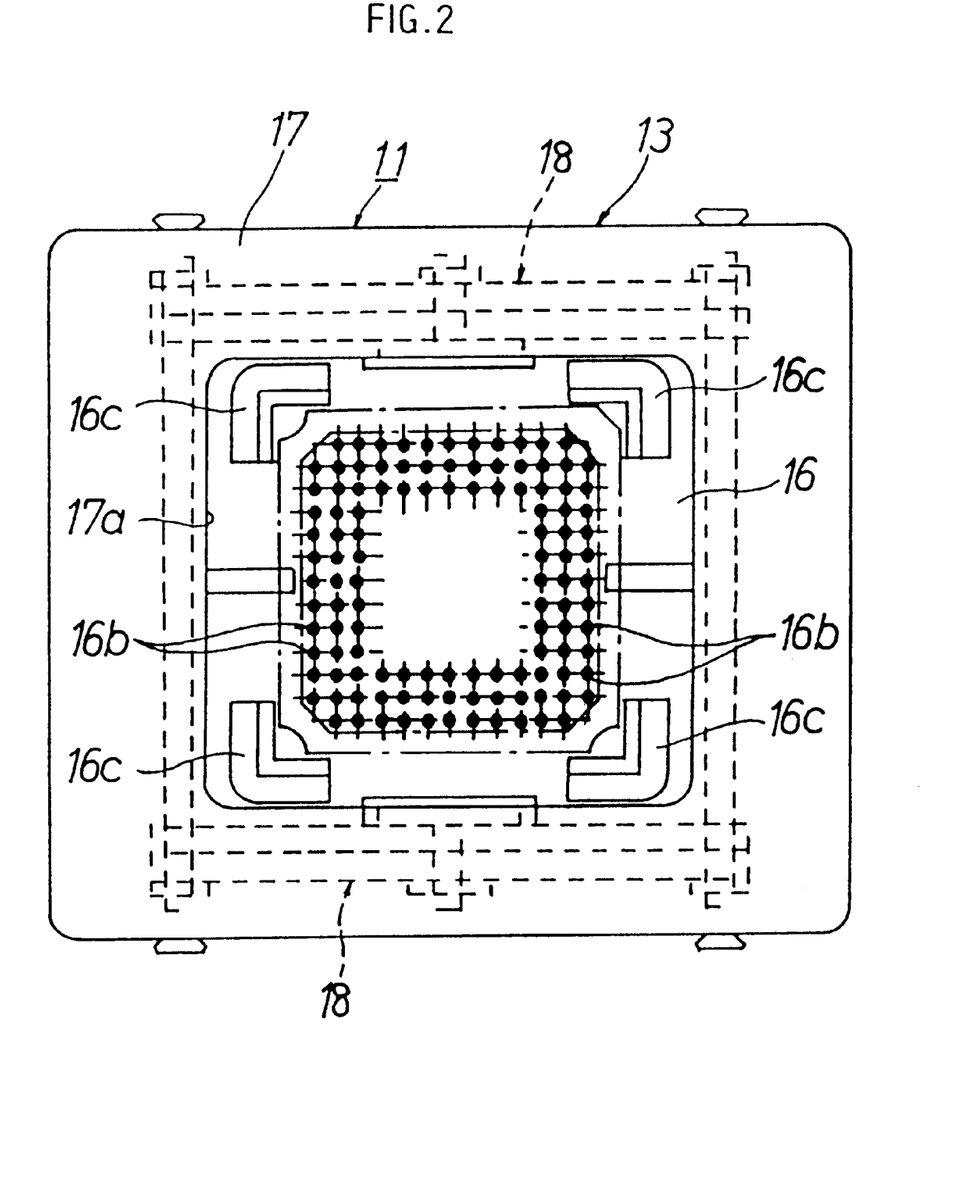
FIG. 2 is a plan view of an IC socket according to the first embodiment.

Still furthermore, as shown in FIGS. 2 and 4, the upper operation member 17 has a rectangular frame structure having an opening 17a having a size capable of being inserted with the IC package 12, which is inserted through this opening 17a and then mounted on the upper plate 16. The upper operation member 17 is also disposed to the socket body 13 to be vertically movable through a slide portion 17b. As shown in FIGS. 3 and 4, the upper operation member 17 is urged upward by means of spring 20 disposed between this operation member 17 and the socket body 13.

Further, the X-shaped links 18 are disposed on both the side portions of the rectangular movable plate 14 along the transversely moving direction thereof to thereby constitute a toggle joint mechanism.

In more detail, each of the X-shaped links 18 has a first link member 23 and a second link member 25 both having the same length as shown in FIG. 3 and coupled together to be rotatable by means of a central coupling pin 27. The first link member 23 has a lower end portion 23a to be connected to the lower end of the socket body 13 to be rotatable by means of a coupling pin 29, and the second link member 25 also has a lower end portion 25a to be connected to one end portion of the side surface portion along the transversely moving direction of the movable plate to be rotatable by means of a lower end coupling pin 30. These first and second link members 23 and 25 have upper end portions 23b and 25b which are connected to the upper operation member 17 by means of upper end coupling pins 33 and 34, respectively. A long hole, i.e. slot, is formed to the upper end portion 23b of the first link member 23, which is connected to the upper operation plate 17 by means of the upper coupling pin 33 through this slot.

A latch, not shown, is disposed to the socket body 13 so as to be rotatable about an axis of the lower end portion thereof so that the latch is engaged with or disengaged from the side edge portion of the IC package 12 set to a predetermined position and is urged by a spring in an engaging direction thereof. A cam portion is formed to the upper operation member 17 to be slidable on the latch for rotating it in the disengaging direction when lowered.

The IC socket 11 having the structure mentioned above will be used in the following manner.

First, a plurality of IC sockets 11 are arranged on the print wiring board by passing the lead portions 19c of the contact pins 19 of the IC sockets 11 through the insertion holes of the print wiring board and then soldering the lead portions 19c thereto.

Next, the IC package 12 is set by, for example, an automatic machine to the IC sockets 11 and electrically connected thereto in the following manner.

That is, the IC socket 11 is pressed downward by lowering the upper operation member 17 against the urging force of the spring with the IC package 12 being supported. Then, the latch is rotated against the urging force of the spring through the engagement with the cam portion of the upper operation member 17, whereby the latch is retired from the insertion area of the IC package 12. At the same time, the movable plate 14 is horizontally moved through the X-links 18, and according to this horizontal movement, the portion 19d of the one clamping piece 19a of the contact pin 19 is pressed by the pressing portion 14a of the movable plate 14 and then twisted to thereby rotate the contacting portion 19e about the portion O in FIG. 8 in an arrowed direction, thus being displaced. Under this state, when the IC package 12 is released from the automatic machine, the solder ball 12b of the IC package 12 is inserted into the through hole 16b of the upper plate 16. During the operation mentioned above, when the upper operation member 17 is lowered, the upper portions 23b and 25b of the respective link members 23 and 25 are pressed downward and lowered, thereby being rotated, and the lower end portion 25a of the second link member 25 is moved transversely (arrowed direction in FIG. 4), whereby the movable plate 14 is moved horizontally in the X-direction.

Thereafter, when the pressing force of the upper operation member 17 imparted by the automatic machine is released, the upper operation member 17 is moved upward by the urging force of the spring 20 and the movable plate 14 returns to its original position. Then, one clamping piece 19a of the contact pin 19 is returned by the elastical force thereof. This clamping piece 19a and the contacting portion 19e contact the solder ball 12b of the IC package 12 and the other clamping piece 19b also contacts the solder ball 12b, thus establishing the electrical connection with the solder ball 12b being supported by both the clamping pieces 19a and 19b.

At the same time, through the upward movement of the upper operation member 17, the latch is rotated by the urging force of the spring and engages with the side portion of the IC package 12, thus holding the IC package 12.

In the structure mentioned above, since the contacting portion 19e of the contact pin 19 is moved obliquely with respect to the moving direction (X) of the movable plate 14, the displacement amount of the contacting portion 19e can be ensured. That is, in the case where the arrangement pitches in X- and Y-directions of the solder balls 12b are made narrow, when the contacting portion 19e moves in the X- and Y-directions, the displacement amount is made extremely short, whereas, when the displacing direction of the contacting portion 19e is inclined by 45° with respect to the X- and Y-directions, so-called a dead space can be effectively utilized, thus ensuring the displacement amount.

Furthermore, since the contacting portion 19e of the contact pin 19 is constructed to be obliquely movable with respect to the moving direction (X-direction) of the movable plate 14, the oriented directions (X- and Y-directions) of the through hole groups 16b of the upper plate 16 can be made along the respective sides of the IC socket 11 having the rectangular outer shape. As a result, the outer configuration of the IC socket 11 can be made compact in comparison with the conventional one.

Still furthermore, in this embodiment, since the one clamping piece 19a of the contact pin 19 is twisted and the contacting portion 19e is made rotatable about the portion O being the center of the rotation, thus achieving the wiping effect. Moreover, the structure of the clamping piece 19a to be twisted makes it possible to make small the displacement amount in the vertical direction of the upper end of the clamping piece 19a in comparison with the arrangement in which it is flexed in the arrowed direction P with the lower portion being the center as shown in FIG. 1, and hence, the solder ball 12b can be surely clamped. That is, in a case where the clamping piece 19a contacts the solder ball 12b in the oblique state of the clamping piece 19a with large displacement amount, a force directing obliquely upward as shown by an arrow N in FIG. 1 acts on the solder ball 12b, and in such case, the solder ball 12b may not be surely clamped. On the contrary, when the clamping piece 19a is twisted, the displacement amount of the upper end thereof is made small, and since the clamping piece 19a is directed obliquely to thereby suppress the contacting thereof to the solder ball 12b, the solder ball 12b can be surely clamped.

Still furthermore, since the solder ball 12b can be clamped and supported from both side portions thereof by the elastically deformable clamping pieces 19a and 19b, even if the solder ball 12b is shifted in its position, the solder ball 12b can be clamped by the clamping pieces 19a and 19b with the center of the solder ball being not shifted in position, and moreover, since both the clamping pieces 19a and 19b are slightly displaceable, no compulsory force is applied to the solder ball 12b. On the other hand, in the case where the solder ball is supported by one 19a of the clamping piece and the inner wall surface of the through hole, 16b of the upper plate 16, there may cause a case that a compulsory force will be applied to the solder ball when the solder ball 12b is shifted in its position because the inner wall surface is not positionally shifted.

Second Embodiment

Figure 10:
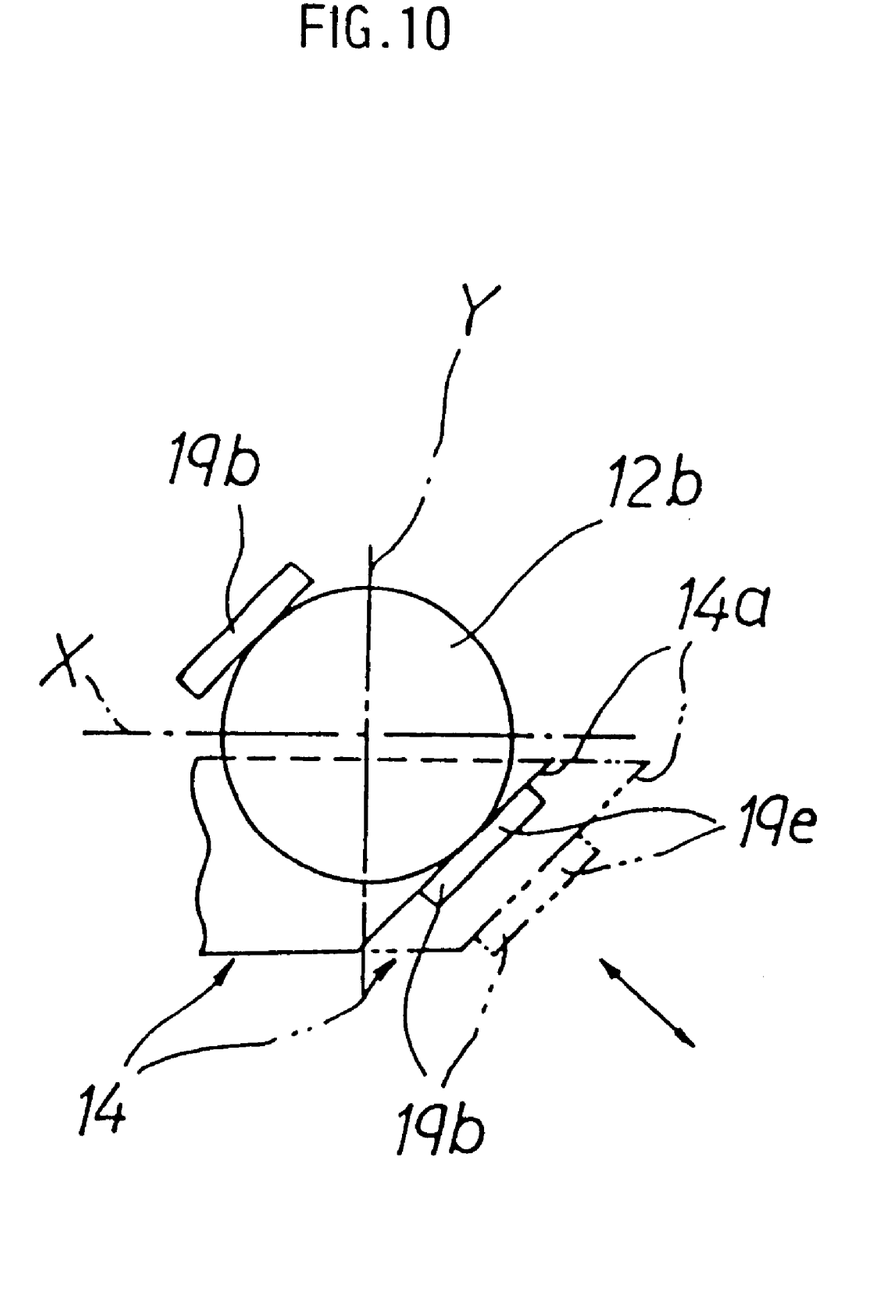
FIG. 10 is a plan view for explaining a function of a contact pin and a solder ball according to a second embodiment of the present invention.

FIG. 10 represents the second embodiment of the present invention, in which the contacting portion 19e of one 19a of the clamping pieces is movable parallelly as shown in FIG. 10, whereas, in the first embodiment, the clamping piece 19a is twisted. That is, the pressing portion 14a formed to the movable plate 14 has an inclination with respect to the moving direction (X-direction) thereof, and when the pressing portion 14a is moved as shown in two-dot and dash-line in FIG. 10, the contacting portion 19e is moved parallelly.

The structures other than the above are substantially the same as those of the first embodiment mentioned hereinbefore.

Third Embodiment

Figure 11:
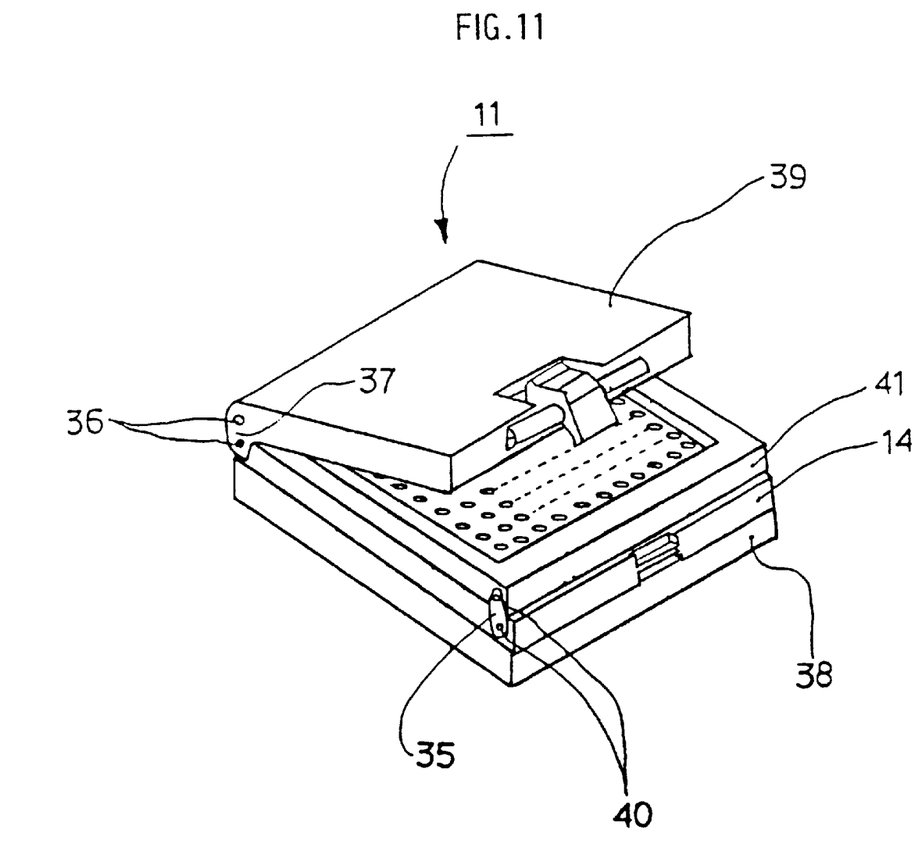
FIG. 11 is a perspective view representing a third embodiment of the present invention.

The third embodiment of the present invention will be described hereunder with reference to FIG. 11. In the first and second embodiments mentioned above, the present invention is applied to an IC socket 11 of an open-top-type in which an electrical part is inserted through an opening formed to an upper surface of the socket as a socket for electrical parts, whereas, in the third embodiment, the present invention is applied to an IC socket of so-called a clamshell type in which an electrical part is mounted on a rest plate and a lid is applied to be rotatable from the upper side thereof to press downward the electrical part.

That is, in the third embodiment, the movable plate 14 and an upper plate 41 are mounted to a socket body 38, and a lid 39 is disposed to the upper surface of the upper plate 41 to be rotatable. The lid 39 has, in one side, a connection portion 37 which connects the movable plate 14 and the upper plate 41 through a connecting portion 37 by means of a coupling pin 36. The other sides of the movable plate 14 and the upper plate 41 are connected through a link member 35 and a coupling pin 40. When the lid 39 is rotated, the movable plate 14 is moved horizontally with respect to the socket body 38 through the operation of the connecting portion 37 and the link member 35, and as like in the first and second embodiments, the clamping piece 19a, not shown, of the contact pin 19 is obliquely displaced with respect to the moving direction (X-direction) of the movable plate 14. The operation and function other than the above are substantially the same as those mentioned with reference to the first and second embodiments.

It is to be noted that the present invention is not limited to the described embodiments and many other changes and modifications may be made without departing from the scopes of the appended claims.

For example, it is to be noted that although, in the respective embodiments mentioned above, the present invention is applied to an IC socket as "socket for electrical parts", the present invention is not limited to this and will be applicable to the other devices or the like. Furthermore, in the above embodiments, although a pair of clamping pieces are disposed to the contact pin to thereby clamp the terminal, i.e. solder ball, from both the sides, the terminal may be supported by contacting the clamping piece only from one side. The terminal of an electrical part to which the contact pin contacts is not limited to the spherical solder ball as mentioned above and may be formed as a rod-like member.

What is claimed is:

1. A socket for an electrical part, which comprises a socket body, a contact pin disposed to the socket body, a movable member mounted on the socket body and adapted to displace the contact pin and an operation means for moving the movable member to thereby displace the contact pin, and in which when the contact pin is displaced, a terminal of an electrical part is fitted to the socket body with the terminal being in non-contact state to the contact pin and when the movable member is returned to an original position before the movement thereof, the displacement of the contact pin is released and the terminal of the electrical part contacts an contacting portion of the contact pin to thereby establish an electrical connection therebetween, wherein said contacting portion comprises a pair of contact pieces of the contact pin adapted to clamp the terminal therebetween, an arrangement of the contact pieces has a direction inclined obliquely with respect to the moving direction of the movable member, and the direction of the displacement of the contacting portion of the contact pin is set to a direction oblique with respect to the moving direction of the movable member.

2. A socket for an electrical part according to claim 1, wherein said movable member is provided with a pressing portion pressing the contact pin, said pressing portion being formed obliquely with respect to the moving direction of the movable member and said contacting portion of the contact pin is moved in parallel in an oblique direction with respect to the movable member by pressing the contact pin by the pressing portion of the movable member.

* * * * *